United States Patent
Li et al.

(10) Patent No.: US 8,912,459 B2
(45) Date of Patent: Dec. 16, 2014

(54) BATTERIES TESTING AND SORTING SYSTEM AND THE METHOD THEREOF

(75) Inventors: Mao Li, Shanghai (CN); George Zhang, Windsor, CT (US); Srinivas Nidamarthi, Auburn Hills, MI (US); Tuanwei Wang, Shanghai (CN); Ashutosh Srivastava, Bangalore (IN)

(73) Assignee: ABB Technology Ltd., Zurich (CH)

( * ) Notice: Subject to any disclaimer, the term of this patent is extended or adjusted under 35 U.S.C. 154(b) by 0 days.

(21) Appl. No.: 13/822,692

(22) PCT Filed: Nov. 8, 2010

(86) PCT No.: PCT/CN2010/078522
§ 371 (c)(1),
(2), (4) Date: Mar. 13, 2013

(87) PCT Pub. No.: WO2012/061970
PCT Pub. Date: May 18, 2012

(65) Prior Publication Data
US 2013/0175206 A1 Jul. 11, 2013

(51) Int. Cl.
*B07C 5/344* (2006.01)
*H01M 10/48* (2006.01)
*G01R 31/36* (2006.01)

(52) U.S. Cl.
CPC .............. *B07C 5/344* (2013.01); *G01R 31/3627* (2013.01); *H01M 10/482* (2013.01); *G01R 31/36* (2013.01)
USPC ........... 209/575; 209/571; 209/606; 209/617; 209/630

(58) Field of Classification Search
USPC .................. 209/571, 606, 617, 630, 936, 575
See application file for complete search history.

(56) References Cited

U.S. PATENT DOCUMENTS 3,480,140 A * 11/1969 Unkefer ......................... 209/575
4,363,407 A * 12/1982 Buckler et al. ................. 209/3.3
(Continued)

FOREIGN PATENT DOCUMENTS

| CN | 101339223 A | 1/2009 |
| CN | 201177657 Y | 1/2009 |
| CN | 201450064 U * | 5/2010 |

OTHER PUBLICATIONS

The State Intellectual Property Office, P.R. China, International Search Report re International Application No. PCT/CN2010/078522, dated Aug. 11, 2011.

(Continued)

*Primary Examiner* — Terrell Matthews
(74) *Attorney, Agent, or Firm* — Anthony M. Del Zoppo, III; Driggs, Hogg, Daugherty & Del Zoppo Co., LPA

(57) ABSTRACT

A system includes a robot, comprising a manipulator and a controller, with a gripper mounted on the manipulator, for picking the battery for testing and sorting, a battery holding section for receiving batteries for testing and sorting at predetermined locations in the battery holding section, and a testing section disposed within the working range of the robot, for testing an electrical condition of the battery for testing and sorting, whereby the controller controls the manipulator and the gripper to first-pick the battery for testing and sorting at the predetermined location from the battery holding section and place it to contact the testing section for testing, the testing section tests the battery and sends to the controller a signal indicating the electrical condition of the tested battery, and the controller controls the manipulator and the gripper to second-pick the battery contacting the testing section and sort it according to the signal.

14 Claims, 6 Drawing Sheets

(56) References Cited

U.S. PATENT DOCUMENTS

| | | | |
|---|---|---|---|
| 6,781,344 B1* | 8/2004 | Hedegor et al. | 320/106 |
| 2004/0155626 A1* | 8/2004 | Hedegor et al. | 320/116 |
| 2009/0030428 A1* | 1/2009 | Omori et al. | 606/130 |
| 2009/0163948 A1* | 6/2009 | Sunaoshi et al. | 606/205 |
| 2011/0288667 A1* | 11/2011 | Noda et al. | 700/98 |

OTHER PUBLICATIONS

The State Intellectual Property Office, P.R. China, International Preliminary Report on Patentability re International Application No. PCT/CN2010/078522, dated Feb. 4, 2013.

* cited by examiner

BATTERIES TESTING AND SORTING SYSTEM AND THE METHOD THEREOF

RELATED APPLICATION

This application is a national filing of PCT application Serial No. PCT/CN2010/078522, filed Nov. 8, 2010.

TECHNICAL FIELD

The invention relates to the field of battery testing and sorting system and the method thereof, and more particularly to a system for testing and sorting battery according to its electrical condition and the method thereof.

BACKGROUND ART

Automatic testing and sorting system has big potential market, it could be used in sorting of cylindrical batteries such as 18650 Notebook batteries and prismatic power batteries including EV and energy storage batteries. And it also could be used in sorting process for some other products which need to be tested & sorted.

At present, the manual sorting technology is pretty mature in the industry. Most of battery manufactures need a lot of workers to operate testing equipment manually during their battery sorting, or combine manual and semi-automatic testing equipment in the sorting process. These operations do not have much automation with high labor cost, low efficiency, low accuracy and inconsistence. The quality requirement of products is hard to meet.

In order to automate the sorting process, specifically-built sorting machine has been invented and used. However, the hard automation machine is costly, lack of flexibility therefore hard to be popular in the industry. For example, U.S. Pat. No. 6,781,344 discloses a battery testing and sorting apparatus. Batteries are fed to a conveyor by a battery feeding section disposed along the length of the conveyor, the batteries are tested by a testing section disposed along the length of the conveyor upstream from the feeding section, and are sorted by a sorting section disposed along the length of the conveyor upstream from the testing section. The battery testing and sorting apparatus is for continuously sorting large quantity of batteries into groups based on the electrical condition of the batteries. This invention is inflexible because it requires the batteries to be positioned on a conveyor that sequentially passes by the feeding section, the testing section and the sorting section disposed along the length of the conveyor. This is an inflexible configuration of the elements of the battery testing and sorting apparatus that defeats its adaptability to various shapes of mounting space. Additionally, the process of feeding, testing and sorting are incapable of performing in parallel. Furthermore, the invention provides no disclosure for programming a number of classification and parameters values for each group of batteries.

KR. Pat. No. 2005002233 discloses another battery testing and sorting apparatus for automatically sorting notebook battery cells in grades. This invention also requires batteries to be carried by the battery cell supply unit that moves in a path determined by the positions of a battery cell feeding unit, a battery cell inspection unit, a battery cell sorting unit. This invention does not allow feeding, testing and sorting performed in parallel. And, the invention does not have the ability of programming the classification and parameters for each group of batteries.

Similar technical problems as above may also find in CN. Pat. 200988037 and CN. Pat. 201239720.

U.S. Pat. No. 6,674,287 is another example of a battery testing device directed to measuring the impedance spectrum of unit cells in a predetermined frequency region at the same temperature and state of charge. This invention is limited to testing whether two or more cells having the smallest difference in the impedance spectrum for battery pack and does not have the ability to sort batteries into additional groups, nor is there any need given in the intended venting purpose of this invention. As such, the invention is incapable of sorting batteries into a plurality groups based on their electrical conditions.

BRIEF SUMMARY OF THE INVENTION

It is therefore an objective of the invention to provide a system for testing and sorting batteries, comprising: an industrial robot, comprising a manipulator and a controller, with a gripper mounted on the manipulator, for picking the battery for testing and sorting; a first battery holding section disposed within working range of the industrial robot, for receiving batteries for testing and sorting at predetermined locations in the first battery holding section; and a testing section disposed within the working range of the industrial robot, for testing an electrical condition of the battery for testing and sorting; whereby: the controller is adapted to control the manipulator and the gripper to first-pick the battery for testing and sorting at the predetermined location from the first battery holding section and place it to contact the testing section for testing; the testing section is adapted to test the battery and send to the controller a signal indicating the electrical condition of the tested battery; and the controller is adapted to control the manipulator and the gripper to second-pick the battery contacting the testing section and sort it according to the signal.

It is another objective of the invention to provide a method for testing and sorting batteries received at a first predetermined location in a first battery holding section by an industrial robot and a testing section, the industrial robot comprising a manipulator and a controller, wherein a gripper is mounted on the manipulator for picking the battery for testing and sorting and both of the first battery holding section and the testing section are disposed within a working range of the industrial robot, comprising:

i. the controller controlling the manipulator and the gripper to first-pick the battery for testing and sorting at the predetermined location from the first battery holding section and place it to contact the testing section for testing;
  ii. the testing section testing the battery and sending to the controller a signal indicating the electrical condition of the tested battery; and
  iii. the controller controlling the manipulator and the gripper to second-pick the battery contacting the testing section and sort it according to the signal.

By having an industrial robot in the system and the method thereof, it could replace/substitute workers for all material handling, testing and sorting etc. This scheme could simplify the sorting system; reduce the worker's operation and human error. Therefore, it cuts the labor cost, improves the productivity, sorting accuracy, and the consistency/coherence of the product. In addition, the same industrial robot is performing the pick and place of the battery for testing and sorting. The test command and results has transferred to and fro the robot on network with the testing section. After testing, robot makes the sorting based on the testing results and predefined rules. Furthermore, all signals and parameters could be set in the memory of the controller of the robot. All control operation of the testing station and grippers are done by Robot controller itself without any other controller like PLC and etc.

It is another objective of the invention to provide A system for testing and sorting batteries, comprising: an industrial robot, comprising a manipulator and a controller, with a gripper mounted on the manipulator, for picking the battery for testing and sorting; a first battery holding section disposed within working range of the industrial robot, for receiving batteries for testing and sorting at predetermined locations in the first battery holding section; and a testing section being arranged be integrated with the gripper, for testing an electrical condition of the battery for testing and sorting; whereby: the controller is adapted to control the manipulator and the gripper to pick the battery for testing and sorting at the predetermined location from the first battery holding section; the testing section is adapted to test the battery and send to the controller a signal indicating the electrical condition of the tested battery when the gripper picks the battery; and the controller is adapted to control the manipulator and the gripper sort the tested battery according to the signal.

It is another objective of the invention to provide A method for testing and sorting batteries received at a first predetermined location in a first battery holding section by an industrial robot and a testing section, the industrial robot comprising a manipulator and a controller, wherein a gripper is mounted on the manipulator for picking the battery for testing and sorting, the first battery holding section is disposed within a working range of the industrial robot, and the testing section is integrated with the gripper; comprising:

i. the controller controlling the manipulator and the gripper to pick the battery for testing and sorting at the predetermined location from the first battery holding section, and the testing section testing the battery picked by the gripper and sending to the controller a signal indicating the electrical condition of the tested battery; and ii. the controller controlling the manipulator and the gripper to sort the tested batteries according to the signal.

By having the configuration of the system and the method thereof, since the testing section is combined with the gripper and does not occupy any additional installation space, this configuration renders the system more compact and simple. Furthermore, such integration allows picking the battery for testing and sorting from the first battery holding section and performing the testing simultaneously; thus, the whole cycle will only pick and place so the sorting time is minimized.

BRIEF DESCRIPTION OF THE DRAWINGS

The subject matter of the invention will be explained in more detail in the following text with reference to preferred exemplary embodiments which are illustrated in the drawings, in which.

The reference symbols used in the drawings, and their meanings, are listed in summary form in the list of reference symbols. In principle, identical parts are provided with the same reference symbols in the figures.

PREFERRED EMBODIMENTS OF THE INVENTION

Referring to the figures, the invention will be described in more detail. The same reference number indicates the same part in different figures.

Figure 1A:
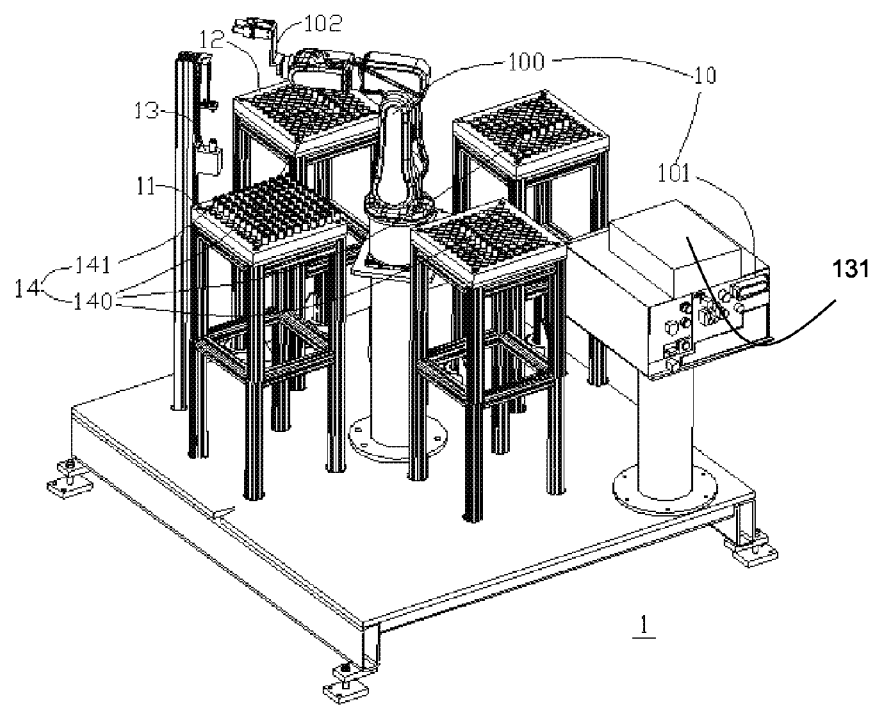
FIG. 1A illustrates a battery testing and sorting system according to an embodiment of present invention.

FIG. 1A illustrates a battery testing and sorting system according to an embodiment of present invention. As shown in FIG. 1A, the system 1 for testing and sorting batteries comprises an industrial robot 10. The industrial robot 10 further comprises a manipulator 100, a controller 101, and a gripper 102 mounted on the manipulator 100. The gripper 102 is used for picking the battery for testing and sorting with the movement of the manipulator 100 under the control of the controller 101. The industrial robot 10 has a working range depending on the size and the freedom degree of the manipulator 100 and the size of the gripper 102. The freedom degree and size of the manipulator 100 are determined based on the requirement of the working range of the industrial robot 10, so as to render the gripper 102 able to reach a first battery holding section 11, a second battery holding section 12, and a testing section 13 which will be described later.

Preferably as shown in FIG. 1A, the first battery holding section 11, the second battery holding section 12, and the testing section 13 are arranged around the industrial robot 10 and within its working range. In this setup, the manipulator 100 may be fixed on a stand. The system contains but not limits to the configuration showed in FIG. 1. All aspects including the space location, layout and parts coming in and out pattern could be changeable. It also could be done with configurations in which the sorted objects that come in and out through manual loading or automated conveyors. Particularly, the first battery holding section 11 and three second holding sections 12 cycle around the industrial robot 10 at the same level, and the testing section 13 is disposed between the first battery holding section 11 and one of the second battery holding sections 12 at higher level than each of the first battery holding section 11 and three second holding sections 12. The testing section 13 comprises a probe 130 for testing the battery 14, a measurement device 131 for comparing the tested signal to a threat hold, and a leg for support the probe 130 on the ground. Alternatively, as long as each of the first battery holding section 11, the second battery holding section 12, and the testing section 13 is disposed within the working range of the industrial robot 10, its location with respect to the industrial robot 10 can be shifted so as to adapt to various profiles of the installation space of the system 1. Such configuration of cycle renders the system more compact and simple.

Figure 1B:
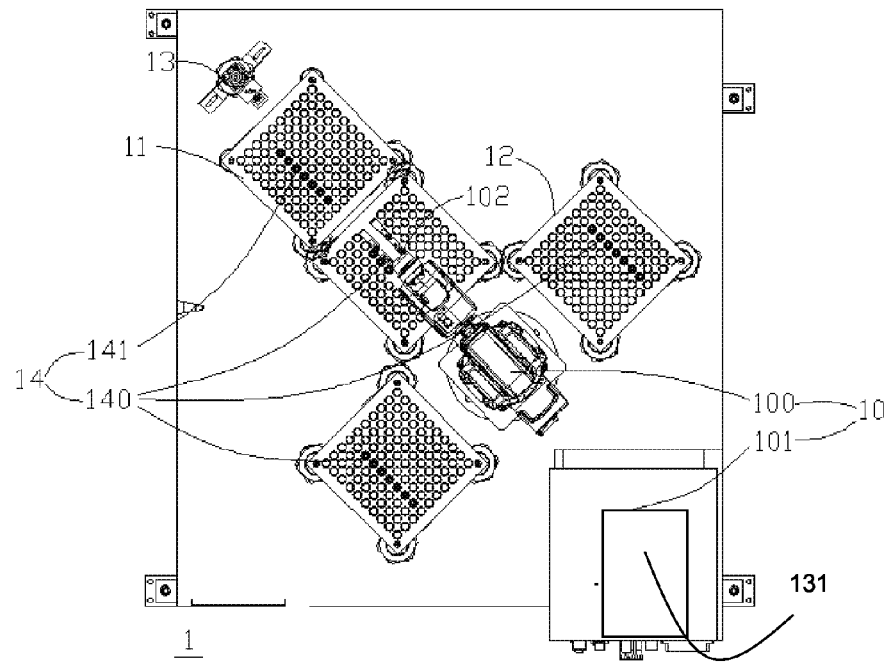
FIG. 1B shows a top-view of a battery testing and sorting system according to another embodiment of present invention.

FIG. 1B shows a top-view of a battery testing and sorting system according to another embodiment of present invention. The same reference number indicates the same part as in FIG. 1A, and for the avoidance of redundancy, its description is omitted here. As shown in FIG. 1B, the first battery holding section 11 is disposed apart from the industrial robot 10 within the working range of the industrial robot 10. One of the second battery holding sections 12 is disposed along the first battery holding 11 and spaced apart from the industrial robot 10 within its working range. The other second battery holding sections 12 are disposed in parallel with the former second battery holding section 12 within the working range of the industrial robot 10. The testing section 13 is disposed along the first battery holding section 11 and the second battery holding section 12 within the working range of the industrial robot 10. Such configuration makes the system suitable for a narrower installation space.

Figure 1C:
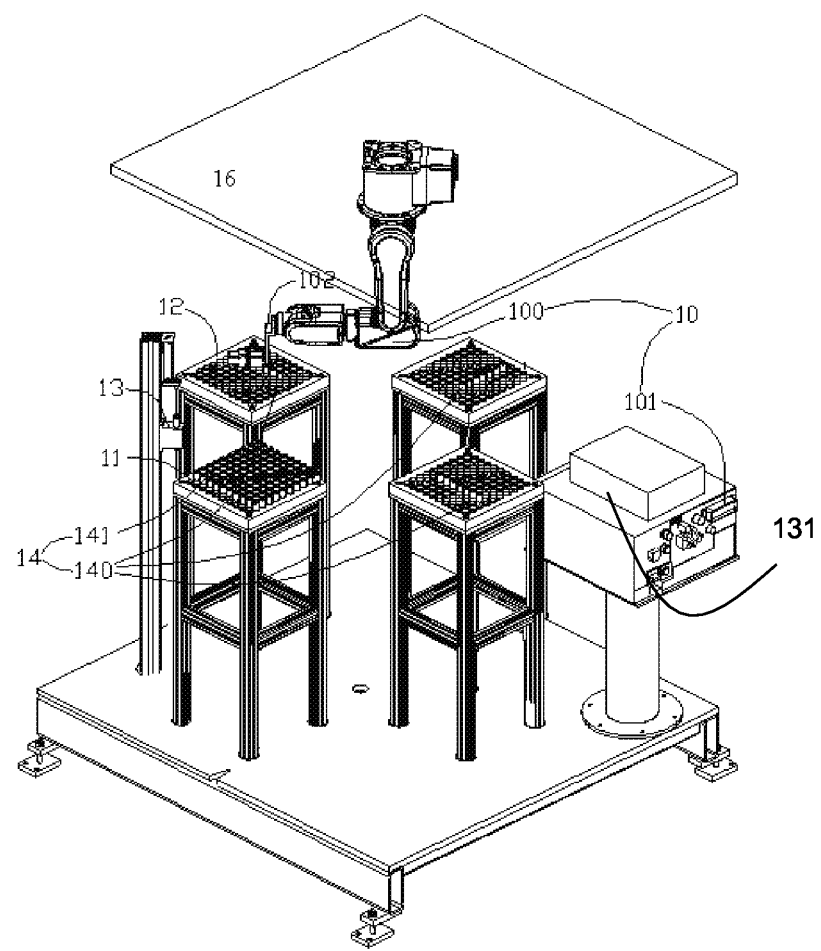
FIG. 1C illustrates a battery testing and sorting system according to another embodiment of present invention.

FIG. 1C illustrates a battery testing and sorting system according to another embodiment of present invention. The same reference number indicates the same part as in FIG. 1A, and for the avoidance of redundancy, its description is omitted here. As shown in FIG. 1C, the industrial robot 10 can be positioned upside down or mounted on a wall 16 to save the installation space and resolve the difficulty of overall configuration of the system, as long as the manipulator 100 (with gripper 102) can reach the tested batteries 14, the batteries 14 to be tested, and the testing section 13. This configuration is helpful for saving the ground area of the installation space.

Figure 1D:
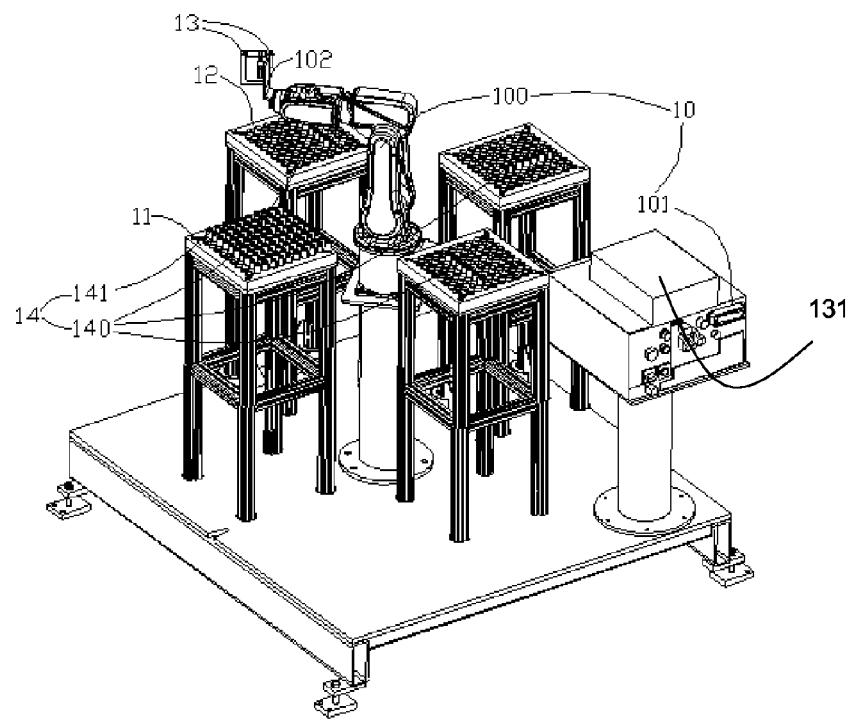
FIG. 1D illustrates a battery testing and sorting system according to another embodiment of present invention.

FIG. 1D illustrates a battery testing and sorting system according to another embodiment of present invention. The same reference number indicates the same part as in FIG. 1A, and for the avoidance of redundancy, its description is omitted here. As shown in FIG. 1D, the first battery holding section 11, the second battery holding section 12 are arranged around the industrial robot 10 and within its working range. Particularly, the first battery holding section 11 and three second holding sections 12 cycles around the industrial robot 10 at the same level, and the probe of the testing section 13 is integrated into the gripper 102. Since the testing section 13 is combined with the gripper 102 and does not occupy any additional installation space, this configuration renders the system more compact and simple than that of FIG. 1A. Furthermore, such integration allows picking the battery for testing and sorting from the first battery holding section and performing the testing simultaneously; thus, the whole cycle will be only picked and placed so the sorting time is minimized.

Figure 1E:
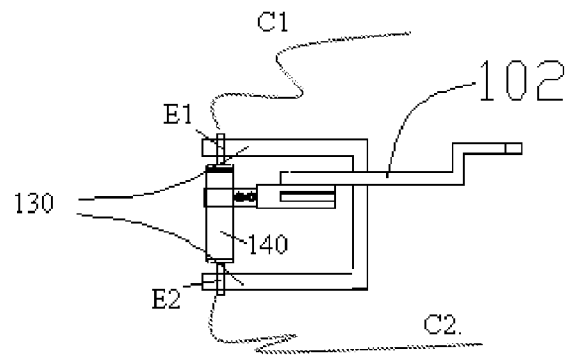
FIG. 1E shows a close-view of the integration of the probe and the gripper corresponding to the configuration of FIG. 1D.

FIG. 1E shows a close-view of the integration of the probe and the gripper corresponding to the configuration of FIG. 1D. As shown in FIG. 1E, the probe 130 is fixed with the gripper 102. When the gripper 102 picks the battery 140 for testing and sorting, the electrodes E1, E2 of the battery 140 are contacting the testing poles of the probe 130. The outputs of the probe 130 are electrically are connected to the two terminals on the measurement device 131 (not shown) respectively via two cables C1, C2.

For any of the above embodiments, the first battery holding section 11, the second battery holding section 12 and the testing section 13 may overlap with one another, while leave sufficient interval therebetween to allow the gripper to pick and/or place the batteries. This further reduces the ground area of the installation space.

Such variable configurations of the system for testing and sorting batteries allow the flexible configuration of the locations for holding the battery to be tested, receiving the tested battery, and the industrial robot according to various installation spaces. These configurations can be made freely and the change of configuration can be easily reprogrammed through re-teaching the robot positions accordingly.

Continuing to refer to FIGS. 1A to 1D, the first battery holding section 11 receives batteries 14 for testing and sorting. The batteries 14 for testing and sorting are positioned at predetermined locations in the first battery hold section 11. The controller 101 of the industrial robot 10 can be programmed to control the manipulator 100 together with the gripper 102 to reach the predetermined locations so as to pick the batteries 14 for testing and sorting 141. A plurality of second battery holding sections 12 receive the sorted batteries 14 for different classifications 140. The testing section 13 tests an electrical condition of the battery 14 for testing and sorting. In the preferred embodiment, either of the first battery holding section 11 and the second battery holding section 12 is a kind of pallet with a flat transport structure that supports the batteries 14 for testing and sorting 141 and the tested and sorted batteries 140. The pallets themselves are supported by legs on the ground. The pallet is divided into cells, each of which has a predetermined location that is preset by the teach pedant and memorized by the controller 101 of the industrial robot 10, for accommodating the battery 14 for sorting and testing 141 and the tested and sorted battery 140. The shape of the cell is adapted to suit the shape of the battery so that the cell can hold the battery exact at the predetermined location. Pallet (battery holding section) and battery testing section both have cells which are similar to the batteries' outer diameter; we use the cells to hold the batteries.

The controller 101 controls the manipulator 100 together with the gripper 102 to firstly pick the battery 14 for testing and sorting at the predetermined location from the first battery holding section 11 and place it to contact the testing section 13 for testing. The testing section 13 tests the battery 14 and sends to the controller 101 a signal indicating the electrical condition of the tested battery 14. And, the controller 101 controls the manipulator 100 and the gripper 102 to secondly pick the battery 14 contacting the testing section and sort it according to the signal to different second battery holding sections 12 for different classification. While the batteries may be sorted according to any number of electrical conditions and characteristics, for purposes of the preferred embodiment described herein, however, the testing section will test for battery voltage and/or internal resistance. About the testing criteria, for example: batteries 14 will be put in one of the second battery holding sections 12, while its voltage smaller than 2.4v, batteries 14 will be put in the other of the second battery holding sections 12, while its voltage greater than 3.2v, batteries will be put in another of the second battery holding sections 12 while its voltage between 2.4v and 3.2v.

By having an industrial robot in the system, it could replace/substitute workers for all material handling, testing and sorting etc. This scheme could simplify the sorting system; reduce the worker's operation and human error. Therefore, it cuts the labor cost, improves the productivity, sorting accuracy, and the consistency/coherence of the product. In addition, the same industrial robot is performing the pick and place of the battery for testing and sorting. The test command and results has transferred to and fro the robot on network with the testing section. After testing, robot makes the sorting based on the testing results and predefined rules. Furthermore, all signals and parameters could be set in the memory of the controller of the robot. All control operation of the testing station and grippers are done by Robot controller itself without any other controller like PLC and etc.

Continuing to refer to FIGS. 1A to 1D, the system 1 further comprises a teach pedant 15 for communication the controller 101 of the industrial robot 10 with user for setting parameters for sorting. The testing section 13 and the industrial robot 10 are integrated tightly through dedicate communication. The number of classification and the parameter such as internal resistance and voltage ranges are setup through a graphical user interface on the robot teach pendant and stored in the memory of the robot controller 101. All motions and measurement even some detection of battery holding section's presence can be controlled by the robot controller. There is no other control devices needed for the robotic automated sorting cell/station. Utilizing the characteristics of the flexibility of the robot programming, number of classification and parameter values for each group can be set quickly so it is particularly suitable for those products which need to be classified into multiple levels.

Figure 2A:
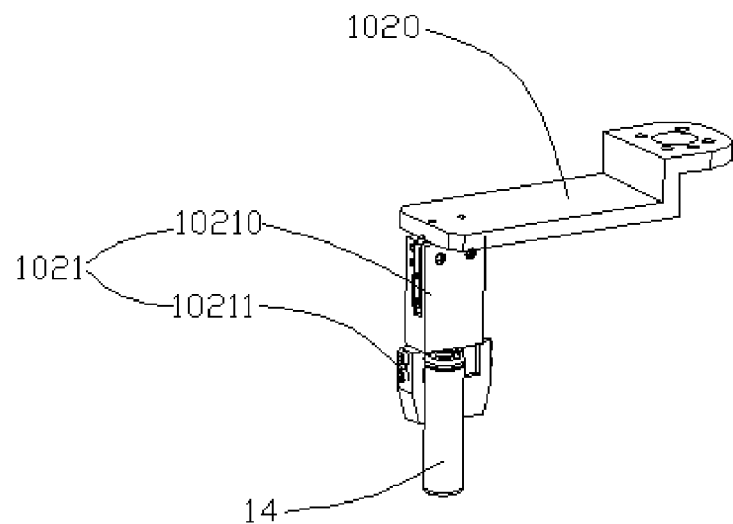
FIG. 2A shows a close-up view of the gripper according to an embodiment of present invention.

FIG. 2A shows a close-up view of the gripper according to an embodiment of present invention. As shown in FIG. 2A, the gripper 102 comprises a gripper body 1020 and a picker 1021. The picker 1021 comprises a pneumatic cylinder 10210 and a jaw 10211. The pneumatic cylinder 10210 is controlled by the controller of 101 of the industrial robot 10, in particular, the controller 101 controls a pressed air to enter into and/or go out of the tube at one end of the pneumatic cylinder 10210, hence impart force to the claw 10211 which extends from the tube at the other end of the pneumatic cylinder 10210, so that it can squeeze and/or release a battery 14. In a preferred embodiment, the gripper body 1020 is a step-like part, for mechanically linking a mounting flange on the manipulator 100 of the industrial robot and the picker 1021 to the upper side and lower side of the gripper body 1020 by fastener, such as bolt or screw . . . . Under the control of controller 101, when the gripper 102 reaches the batteries 14 to be picked in the first battery holding section 11 or the batteries 14 being tested at the testing section 13, it picks the batteries 14 in the first battery holding section 11 and places them contacting the testing section 13, and picks the battery 14 being tested by the testing section 13 and places it at one of the second battery holding sections according to the signal indicating the battery electrical condition. Because of only one jaw, the picking and placing the battery to be tested and the picking and placing the battery tested are performed sequentially.

Figure 2B:
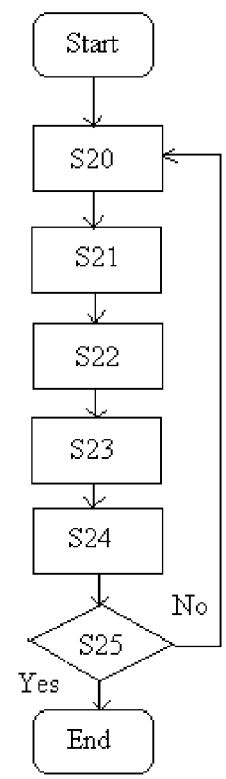
FIG. 2B shows a flow chart depicting the process of battery testing and sorting according to an embodiment of present invention corresponding to FIG. 2A.

FIG. 2B shows a flow chart depicting the process of battery testing and sorting according to an embodiment of present invention corresponding to FIG. 2A. As shown in FIG. 2B, in step 20, the number of groups for classification of batteries and the range parameters are set via a teaching pedant. Next, in step S21, the controller 101 of the industrial robot 10 controls the manipulator 100 and the gripper 102 of the industrial robot 10 to first-pick the battery 14 for testing and sorting at the predetermined location from the battery holding section 11 and place it to contact the testing section 13 for testing. Next in step S22, the testing section 13 tests the battery 14 and sends to the controller 101 a signal indicating the electrical condition of the tested battery 14. Next in step S23, the controller 101 controls the manipulator 100 and the gripper 102 to second-pick the battery 14 contacting the testing section 13 and sort it according to the signal. Next in step S24, the controller 101 controls the manipulator 100 and the gripper 102 to place the sorted batteries 14 to one of the second battery holding sections 12 for classification. Then, in step S25, if all objects are sorted, then go to stop; otherwise, the process goes back to step S20.

Figure 3A:
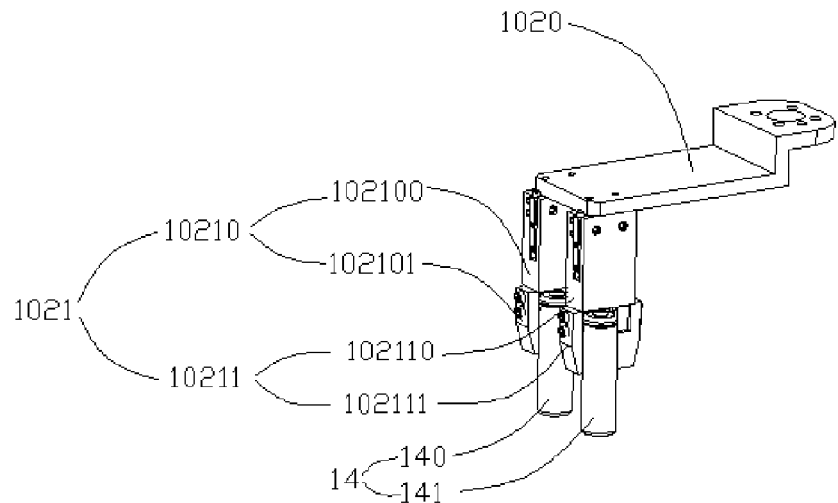
FIG. 3A shows a close-up view of the gripper according to another embodiment of present invention.

FIG. 3A shows a close-up view of the gripper according to another embodiment of present invention. As shown in FIG. 2B, the gripper 102 comprises a gripper body 1020 and two pickers 1021, a first picker 10210 and a second piker 10211, preferably in parallel extending the gripper body 1020. In a preferred embodiment, the first picker 10210 comprises a first pneumatic cylinder 102100 and a first jaw 102101. The first pneumatic cylinder 102100 is controlled by the controller of 101 of the industrial robot 10, in particular, the controller 101 controls a pressed air to enter into and/or go out of the tube at one end of the first pneumatic cylinder 102100, hence impart force to the first jaw 102101 which extends from the tube at the other end of the first pneumatic cylinder 102100, so that it can squeeze and/or release a battery 14. In a preferred embodiment, the gripper body 1020 is a step-like part, for mechanically linking a mounting flange on the manipulator 100 of the industrial robot and the first picker 10210 to the upper side and lower side of the gripper body 1020 by fastener, such as bolt or screw. The second picker 10211 comprises a second pneumatic cylinder 102110 and a second jaw 102111. The second pneumatic cylinder 102110 is controlled by the controller of 101 of the industrial robot 10, in particular, the controller 101 controls a pressed air to enter into and/or go out of the tube at one end of the second pneumatic cylinder 102110, hence impart force to the second jaw 102111 which extends from the tube at the other end of the second pneumatic cylinder 102110, so that it can squeeze and/or release a battery 14. In a preferred embodiment, the gripper body 1020 is a step-like part, for mechanically linking a mounting flange on the manipulator 100 of the industrial robot and the second picker 10211 to the upper side and lower side of the gripper body 1020 by fastener, such as bolt or screw.

In the sorting system described here, with normal operation under the control of controller 101, the first jaw 10210 picks a tested battery 140 from the measurement position of the testing section 13, and the second jaw 10211 successively puts the battery 141 for testing on the measurement position to contact the testing section 13, such as a probe. Namely, the placing of a next battery for testing 141 by the second jaw 10211 immediately follows the pick of the current battery for sorting (tested battery 140) by the first jaw 10210. Thus, during the time the industrial robot 10 sends the measured battery to its destination and picks up another one, the measurement process for the previous battery is performed. In general, measuring need relatively longer time. In this way, the overall battery sorting time can be saved and sorting efficiency can be improved.

Figure 3B:
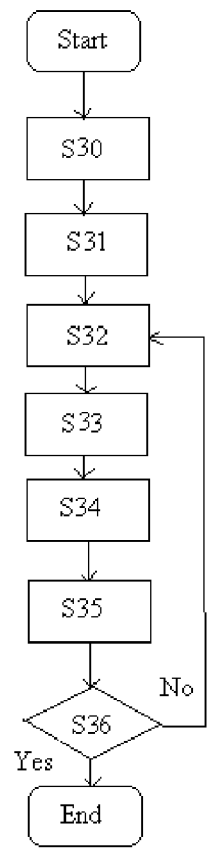
FIG. 3B shows a flow chart depicting the process of battery testing and sorting according to an embodiment of present invention corresponding to FIG. 3A.

FIG. 3B shows a flow chart depicting the process of battery testing and sorting according to an embodiment of present invention corresponding to FIG. 3A. As shown in FIG. 3B, in step S30, the number of groups for classification of batteries and the range parameters are set via a teaching pedant. Next, in step S31, the controller 101 of the industrial robot 10 controls the manipulator 100 and the gripper 102 of the industrial robot 10 to first-pick the battery 14 for testing and sorting at the predetermined location from the battery holding section 11 and place it to contact the testing section 13 for testing and the testing section 13 tests the battery 14; in step S32, the controller 101 of the industrial robot 10 controls the manipulator 100 and the second jaw 10211 of the jaws 1021 to first-picks a next battery 14 for testing and sorting at the predetermined location from the battery holding section 11 and move the next battery 14 close to the testing section 13. In step S33, if the testing is finished, sends to the controller 101 a signal indicating the electrical condition of the tested battery 14. Next in step S34, under the control of controller 101, the first jaw 10210 picks a tested battery 140 from the measurement position of the testing section 13, and the second jaw 10211 successively puts the next battery 141 for testing on the measurement position to contact the testing section 13. Next in step S35, the controller 101 controls the manipulator 100 and the first gripper 10210 to place the sorted batteries 14 to one of the second battery holding sections 12 for classification. Finally, in step S36, goes to step if all objects are sorted, otherwise goes back to step S32. With double-jaw robot gripper, the robot can send the tested battery to its destination and grip another battery to be tested while the measuring is in process. Since most of the time, the measuring process takes longer time comparing with battery moving process, this unique gripping device and procedure will save overall sorting time and improve the production efficiency.

Continuing to refer to FIGS. 2A and 2B, the gripper body 1020 is mounted on a mounting flange of the manipulator 100 of the industrial robot 10 using a fastener such as screw 20. By having the mounting flange, it is easy to switch robot gripper, and the system can also be used for different kinds of objects to be tested and sorted. This sorting system and method could be applied to many types of battery production. For different type of battery such as Cylinder & Button-cell or prismatic (power) battery type, only robot gripper and program need to be modified. A user may only need to have one set of sorting system or several sets of the same kind of sorting systems for series of battery products. Therefore, it may avoid repeated investment, shorten the leading time, and improve the competitiveness. In the long run, the investment is more economical.

Figure 4:
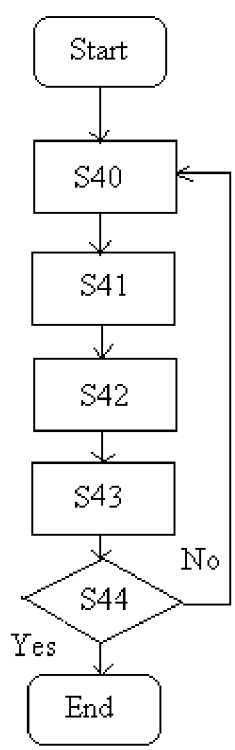
FIG. 4 shows a flow chart depicting the process of battery testing and sorting according to an embodiment of present invention corresponding to FIGS. 1D and 1E.

FIG. 4 shows a flow chart depicting the process of battery testing and sorting according to an embodiment of present invention corresponding to FIGS. 1D and 1E. As shown in FIG. 4, in step S40, the number of groups for classification of batteries and the range parameters are set via a teaching pedant. Next, in step S41, the controller 101 of the industrial robot 10 controls the manipulator 100 and the gripper 102 of the industrial robot 10 to first-pick the battery 14 for testing and sorting at the predetermined location from the battery holding section 11, and simultaneously the probe integrated in the gripper 102 tests the battery 14 and sends to the controller 101 a signal indicating the electrical condition of the tested battery 14. Next in step S42, the controller 101 controls the manipulator 100 and the gripper 102 to sort the battery 14 according to the signal. Next in step S43, the controller 101 controls the manipulator 100 and the gripper 102 to place the sorted batteries 14 to one of the second battery holding sections 12 for classification. Then, in step S44, if all objects are sorted, then go to stop; otherwise, the process goes back to step S40.

Though the present invention has been described on the basis of some preferred embodiments, those skilled in the art should appreciate that those embodiments should by no way limit the scope of the present invention. Without departing from the spirit and concept of the present invention, any variations and modifications to the embodiments should be within the apprehension of those with ordinary knowledge and skills in the art, and therefore fall in the scope of the present invention which is defined by the accompanied claims.

The invention claimed is:

1. A system for testing and sorting batteries, comprising:
an industrial robot, comprising a manipulator and a controller, with a gripper mounted on the manipulator that picks a battery for testing and sorting;
a first battery holding section disposed within a working range of the industrial robot that receives batteries for testing and sorting at predetermined locations in the first battery holding section; and
a testing section disposed within the working range of the industrial robot that tests an electrical condition of the battery for testing and sorting;
whereby:
the controller controls the manipulator and the gripper to first-pick the battery for testing and sorting at the predetermined location from the first battery holding section and place it to contact the testing section for testing;
the testing section tests the battery and sends to the controller a signal indicating the electrical condition of the tested battery; and
the controller controls the manipulator and the gripper to second-pick the battery contacting the testing section and sort it according to the signal.

2. The system for testing and sorting batteries according to claim 1, wherein:
the gripper is mounted on a mounting flange of the manipulator;
the gripper comprises:
a gripper body, being mounted on the mounting flange of the industrial robot;
a first jaw and a second jaw, being arranged to extend from the gripper body,
the first jaw being adapted for the first-pick of the battery for testing and placing it to contact the testing section for testing and the second jaw being adapted for the second-pick of the battery for sorting;
whereby:
the placing of a next battery for testing immediately follows the second-pick of the current battery for sorting.

3. The system for testing and sorting batteries according to claim 2,
whereby:
the first-pick of the current battery for testing precedes the placing of the current battery for testing; and
sorting the current battery according to the signal follows the second-pick of the current battery for sorting.

4. The system for testing and sorting batteries according to claim 1, wherein:
the industrial robot further comprising:
a teach pedant, being adapted for communication with user for setting parameters for sorting.

5. The system for testing and sorting batteries according to claim 1, further
comprising:
a plurality of second battery holding sections, being disposed with the working range of the industrial robot, for receiving the sorted batteries for different classifications.

6. A method for testing and sorting batteries received at a first predetermined location in a first battery holding section by an industrial robot and a testing section, the industrial robot comprising a manipulator and a controller, wherein a gripper is mounted on the manipulator for picking the battery for testing and sorting and both of the first battery holding section and the testing section are disposed within a working range of the industrial robot, comprising:
(a) the controller controlling the manipulator and the gripper to first-pick the battery for testing and sorting at the predetermined location from the first battery holding section and place it to contact the testing section for testing;
(b) the testing section testing the battery and sending to the controller a signal indicating the electrical condition of the tested battery; and
(c) the controller controlling the manipulator and the gripper to second-pick the battery contacting the testing section and sort it according to the signal.

7. The method for testing and sorting batteries according to claim 6,
wherein:
the gripper is mounted on a mounting flange of the manipulator;
the gripper comprises:
a gripper body, being mounted on the mounting flange of the industrial robot; and
a first jaw and a second jaw, being arranged to extend from the gripper body, the first jaw being adapted for the first-pick of the battery and placing it to contact the testing section for testing and the second jaw being adapted for the second-pick of the battery for sorting;
whereby:
the placing of a next battery for testing immediately follows the second-pick of the current battery for sorting.

8. The method for testing and sorting batteries according to claim 7, whereby:
the first-pick of the current battery for testing precedes the placing of the current battery for testing; and
sorting the current battery according to the signal follows the second-pick of the current battery for sorting.

9. The method for testing and sorting batteries according to claim 6, wherein the industrial robot further comprising:
a teach pedant, being adapted for communication with user for setting parameters for sorting.

10. The method for testing and sorting batteries according to claim 6, further comprising step (d) following step (c):
(d) the controller controlling the manipulator and the gripper to place the tested battery into one of a plurality of second battery keeping sections disposed with the working range of the industrial robot.

11. A system for testing and sorting batteries, comprising:
an industrial robot, comprising a manipulator and a controller, with a gripper mounted on the manipulator that picks the battery for testing and sorting;
a first battery holding section disposed within a working range of the industrial robot that receives batteries for testing and sorting at predetermined locations in the first battery holding section; and
a testing section, integrated with the gripper, that tests an electrical condition of the battery for testing and sorting;
whereby:
the controller controls the manipulator and the gripper to pick the battery for testing and sorting at the predetermined location from the first battery holding section;
the testing section that tests the battery and send to the controller a signal indicating the electrical condition of the tested battery when the gripper picks the battery; and
the controller controls the manipulator and the gripper sorts the tested battery according to the signal.

12. The system according to claim 11, further comprising:
a plurality of second battery holding sections, being disposed with the working range of the industrial robot, for receiving the sorted batteries for different classifications.

13. A method for testing and sorting batteries received at a first predetermined location in a first battery holding section by an industrial robot and a testing section, the industrial robot comprising a manipulator and a controller, wherein a gripper is mounted on the manipulator for picking the battery for testing and sorting, the first battery holding section is disposed within a working range of the industrial robot, and the testing section is integrated with the gripper; comprising:
(a) the controller controlling the manipulator and the gripper to pick the battery for testing and sorting at the predetermined location from the first battery holding section, and the testing section testing the battery picked by the gripper and sending to the controller a signal indicating the electrical condition of the tested battery; and
(b) the controller controlling the manipulator and the gripper to sort the tested batteries according to the signal.

14. The method according to 13, further comprising step (d) following step (c):
(c) the controller controlling the manipulator and the gripper to place the sorted battery into one of a plurality of second battery keeping sections disposed with the working range of the industrial robot.

* * * * *